US009635786B2

(12) United States Patent
Leckelt et al.

(10) Patent No.: US 9,635,786 B2
(45) Date of Patent: *Apr. 25, 2017

(54) COMPUTER ROOM AIR CONDITIONING UNIT

(71) Applicant: LEX INDUSTRIES LTD., Edmonton (CA)

(72) Inventors: Lindsey Leckelt, Sherwood Park (CA); Ryan Vetsch, Fort Saskatchewan (CA); Dan Leckelt, Edmonton (CA); Neil Merkel, Spruce Groove (CA); Don Leckelt, Sherwood Park (CA)

(73) Assignee: LEX INDUSTRIES LTD., Edmonton, AB (CA)

( * ) Notice: Subject to any disclaimer, the term of this patent is extended or adjusted under 35 U.S.C. 154(b) by 0 days.

This patent is subject to a terminal disclaimer.

(21) Appl. No.: 15/345,864

(22) Filed: Nov. 8, 2016

(65) Prior Publication Data

US 2017/0064871 A1  Mar. 2, 2017

Related U.S. Application Data

(63) Continuation of application No. 14/510,172, filed on Oct. 9, 2014, now Pat. No. 9,521,783, which is a
(Continued)

(51) Int. Cl.
*H05K 7/20* (2006.01)
*F24D 11/00* (2006.01)
(Continued)

(52) U.S. Cl.
CPC ...... *H05K 7/20745* (2013.01); *F24F 11/0001* (2013.01); *H05K 7/2029* (2013.01); *H05K 7/20145* (2013.01); *H05K 7/20709* (2013.01)

(58) Field of Classification Search
None
See application file for complete search history.

(56) References Cited

U.S. PATENT DOCUMENTS

| 1,782,711 A | 11/1930 | Callahan | F28D 1/024 165/54 |
| 2,338,382 A | 1/1944 | Marlow | F24F 3/1405 165/226 |

(Continued)

FOREIGN PATENT DOCUMENTS

EP  2389056 A1  11/2011  ............ F24F 3/147

*Primary Examiner* — Gregory Huson
*Assistant Examiner* — Eric Gorman
(74) *Attorney, Agent, or Firm* — Hueschen and Sage

(57) ABSTRACT

An enclosed air conditioning unit includes a filter section and a cooling section through which intake air passes before being discharged into a space within a building. The orientation of the filter section and cooling section is substantially vertical, and the airflow path through the filter section and the cooling section is substantially horizontal, resulting in reduced face velocities across these components, thereby increasing filtration efficiency and cooling effectiveness, while allowing the physical size and configuration of the air conditioning unit's enclosure to be the same as or smaller than the enclosures for conventional air conditioning units having comparable or lower performance.

6 Claims, 4 Drawing Sheets

Related U.S. Application Data continuation of application No. 14/003,229, filed as application No. PCT/CA2013/000464 on May 10, 2013, now abandoned.

(60) Provisional application No. 61/646,283, filed on May 12, 2012.

(51) Int. Cl.
| | |
|---|---|
| *F24F 1/02* | (2011.01) |
| *F24F 3/00* | (2006.01) |
| *F24F 3/06* | (2006.01) |
| *F24F 13/28* | (2006.01) |
| *F24F 13/30* | (2006.01) |
| *F28D 15/00* | (2006.01) |
| *F25D 31/00* | (2006.01) |
| *F24F 11/00* | (2006.01) |

(56) References Cited

U.S. PATENT DOCUMENTS

| | | | | |
|---|---|---|---|---|
| 2,779,572 | A | 1/1957 | Holman | F24F 1/02 |
| | | | | 155/48.1 |
| 2,934,324 | A | 4/1960 | Partington | F24F 1/00 |
| | | | | 165/241 |
| 2,984,089 | A | 5/1961 | Whitesel | F24F 1/02 |
| | | | | 415/204 |
| 3,129,753 | A | 4/1964 | Davis | F24F 1/0007 |
| | | | | 165/55 |
| 3,752,226 | A | 8/1973 | Bullock | F24F 3/00 |
| | | | | 165/126 |
| 4,018,266 | A * | 4/1977 | Kay | F24F 1/02 |
| | | | | 165/237 |
| 4,142,575 | A | 3/1979 | Glancy | F24F 12/002 |
| | | | | 165/66 |
| 4,210,278 | A | 7/1980 | Obler | G05D 23/1931 |
| | | | | 165/229 |
| 5,309,725 | A * | 5/1994 | Cayce | F24F 3/1405 |
| | | | | 62/173 |
| 5,400,607 | A | 3/1995 | Cayce | F24F 3/1405 |
| | | | | 62/173 |
| 5,559,673 | A | 9/1996 | Gagnon | G06F 1/20 |
| | | | | 165/122 |
| 6,076,739 | A | 6/2000 | Littleford | F24F 3/044 |
| | | | | 165/222 |
| 6,115,939 | A * | 9/2000 | Kuster | F26B 15/04 |
| | | | | 34/194 |
| 7,036,559 | B2 | 5/2006 | Stanimirovic | F24F 11/0086 |
| | | | | 165/11.1 |
| 8,151,578 | B1 * | 4/2012 | Morales | F24F 3/0442 |
| | | | | 62/259.2 |
| 9,166,258 | B2 * | 10/2015 | Takizawa | B60L 11/1874 |
| 9,204,576 | B2 | 12/2015 | Goulden | H05K 7/20736 |
| 2006/0086138 | A1 | 4/2006 | Park | F24F 1/0007 |
| | | | | 62/428 |
| 2008/0190121 | A1 | 8/2008 | Backman | F24F 3/153 |
| | | | | 62/115 |
| 2009/0205354 | A1 | 8/2009 | Brown | F24F 3/1405 |
| | | | | 62/324.5 |
| 2009/0308250 | A1 | 12/2009 | Rotter | F02M 35/022 |
| | | | | 95/268 |
| 2010/0275630 | A1 | 11/2010 | DeMonte | F24F 1/04 |
| | | | | 62/272 |
| 2012/0167600 | A1 | 7/2012 | Dunnavant | F24F 12/006 |
| | | | | 62/89 |
| 2012/0167610 | A1 | 7/2012 | Dunnavant | F28C 1/14 |
| | | | | 69/314 |
| 2012/0168119 | A1 | 7/2012 | Dunnavant | F24F 3/14 |
| | | | | 165/59 |
| 2012/0171943 | A1 | 7/2012 | Dunnavant | H05K 7/20745 |
| | | | | 454/184 |
| 2012/0267804 | A1 | 10/2012 | Rodrigs | F24F 6/04 |
| | | | | 251/64.1 |
| 2013/0098086 | A1 | 4/2013 | Sillato | F25B 49/02 |
| | | | | 62/184 |
| 2014/0083661 | A1 * | 3/2014 | Leckelt | F24F 11/0001 |
| | | | | 165/163 |
| 2014/0190198 | A1 | 7/2014 | Slessman | H05K 7/20836 |
| | | | | 62/314 |

* cited by examiner

COMPUTER ROOM AIR CONDITIONING UNIT

FIELD OF THE DISCLOSURE

The present disclosure relates in general to air conditioning units for controlling environmental conditions within building spaces, including air conditioning units for computer rooms, data centers (server rooms), and other building spaces intended for uses having special environmental control requirements. The disclosure relates in particular to air conditioning units adapted for installation within the building spaces served by the units.

BACKGROUND

Computer rooms and other building spaces intended for specialized uses often require precise control and regulation of environmental conditions such as temperature and humidity in order to ensure proper operation of equipment (such as but not limited to computers) installed in such building spaces. Cooling requirements for computer rooms are typically much greater and more stringent than for most building spaces due to the need to dissipate heat generated by the computer equipment operating in the computer rooms. Humidity control requirements are typically stringent as well, as excessive moisture in the air in a computer room can cause operational and maintenance problems with the computer equipment.

Accordingly, computer rooms commonly are provided with specialized air conditioning (A/C) systems for controlling and regulating temperature and humidity. It has been common in the past for computer room A/C systems to be located outside the computer room and even outside the building housing the computer room, due to the physical size of the equipment needed to meet the A/C requirements for the computer room in question. In recent years, however, computer room air conditioning units (or "CRAC units") have been developed that are sufficiently compact for installation within a computer room without greatly increasing the required floor area or height of the computer room. Examples of such CRAC units include chilled water or DX (direct expansion) A/C units manufactured by the Liebert® Corporation.

Conventional CRAC units commonly utilize banked (i.e., angularly-oriented) cooling coils specially constructed for use in CRAC unit and arrayed in an A-frame or V-frame configuration within the unit. Airflow typically enters the unit vertically through the top or bottom of the unit and proceeds in a straight, vertical path through the filters and coils. In CRAC units of this type, the air velocity through the filters (also referred to herein as the "face velocity") is comparatively high, which results in reduced filter performance.

Another drawback of known CRAC units is that they cannot be readily adapted to use direct evaporative cooling systems using saturated evaporative media pads without increasing the size of the units so much that their use within a computer room becomes unviable or undesirable. Direct evaporative cooling systems using saturated evaporative media pads rely on gravity to allow water sprayed on top of the unit to trickle down, saturating the pad through which the airstream passing through the CRAC unit travels. Some of the water in the evaporative pad evaporates into the airstream, adiabatically cooling it. Water is collected in a sump located beneath the evaporative pad. However, this type of direct evaporative cooling system cannot be used in conventional CRAC units using a conventional vertical airflow pattern, because the evaporative media pads would have to be oriented horizontally, such that water would not be able to drain from the media by gravity into a drain pan. Moreover, the requirement for the evaporative media to be horizontally oriented for use in a CRAC unit having a vertical airflow pattern would increase the size of the unit and the floor area it requires.

For the foregoing reasons, there is a need for CRAC units characterized by lower face velocities (and therefore better filter performance and efficiency) than conventional CRAC units, without increasing the physical size of the units significantly or at all. In addition, there is a need for CRAC units that can be adapted to use direct evaporative cooling media, without significant effect on the physical size of the units.

BRIEF SUMMARY

In general terms, the present disclosure teaches an enclosed air conditioning unit comprising a filter section and a cooling section in which the airflow path through the filter section and cooling section is substantially horizontal, with the physical size and configuration of the unit's cabinet or enclosure being essentially the same as (or smaller than) the cabinets for conventional air conditioning units having comparable or lower performance capabilities.

In a first aspect, the present disclosure teaches an air conditioning unit comprising an enclosure having a first wall, a second wall opposite the first wall, and a primary air intake in an upper region of the enclosure; and an air treatment component assembly mounted within the enclosure so as to define a first chamber between the component assembly and the enclosure's first wall and a second chamber between the component assembly and the enclosure's second wall. Air entering the primary air intake from outside the enclosure will flow, in sequence, downward within the first chamber, horizontally through the component assembly into the second chamber, and downward within the second chamber toward a discharge outlet in a lower region of the enclosure.

In one particular embodiment in accordance with the above-described first aspect, the air conditioning unit comprises an enclosure (cabinet) having a first wall, a second wall opposite the first wall, and a primary air intake in an upper region of the enclosure; plus an air treatment component assembly including a generally flat filter section and a generally flat cooling section. The filter section and cooling section are installed in parallel juxtaposition, and oriented vertically within the enclosure, so as to define a first chamber between the filter section and the enclosure's first wall, and a second chamber between the cooling section and the enclosure's second wall. Air entering the primary air intake from outside the enclosure will flow, in sequence, downward within the first chamber, horizontally through the filter section and the cooling section into the second chamber, and downward within the second chamber toward a discharge outlet in a lower region of the enclosure. Optionally, the air conditioning unit may include a bypass air intake through which air from outside the unit can flow downward into the second chamber. Embodiments that have a bypass air intake preferably will also have an intake damper for regulating the flow of air into the second chamber.

In a second aspect, the present disclosure teaches an air conditioning unit comprising an enclosure having a first wall, a second wall opposite the first wall, and a primary air intake in a lower region of the enclosure; and an air treatment component assembly mounted within the enclosure so as to define a first chamber between the component assembly and the enclosure's first wall and a second chamber between the component assembly and the enclosure's second wall. Air entering the primary air intake from outside the enclosure will flow, in sequence, upward within the first chamber, horizontally through the component assembly into the second chamber, and upward within the second chamber toward a discharge outlet in an upper region of the enclosure.

In one particular embodiment in accordance with the above-described second aspect, the air conditioning unit comprises an enclosure (cabinet) having a first wall, a second wall opposite the first wall, and a primary air intake in a lower region of the enclosure; plus an air treatment component assembly including a generally flat filter section and a generally flat cooling section. The filter section and cooling section are in parallel juxtaposition and oriented vertically within the enclosure, so as to define a first chamber between the filter section and the enclosure's first wall, and a second chamber between the cooling section and the enclosure's second wall. Air entering the primary air intake from outside the enclosure will flow, in sequence, upward within the first chamber, horizontally through the filter section and the cooling section into the second chamber, and upward within the second chamber toward a discharge outlet in an upper region of the enclosure. Optionally, the air conditioning unit may include a bypass air intake through which air from outside the unit can flow upward into the second chamber. Embodiments that have a bypass air intake preferably will also have an intake damper for regulating the flow of air into the second chamber.

The first and second walls typically will be, respectively, the front and rear walls of the enclosure, such that the first chamber will be adjacent the front wall. In alternative embodiments, however, the first and second walls could be, respectively, the rear and front walls of the enclosure.

BRIEF DESCRIPTION OF THE DRAWINGS

Exemplary embodiments of CRAC units in accordance with the present disclosure will now be described with reference to the accompanying Figures, in which numerical references denote like parts, and in which.

DETAILED DESCRIPTION

Figure 1:
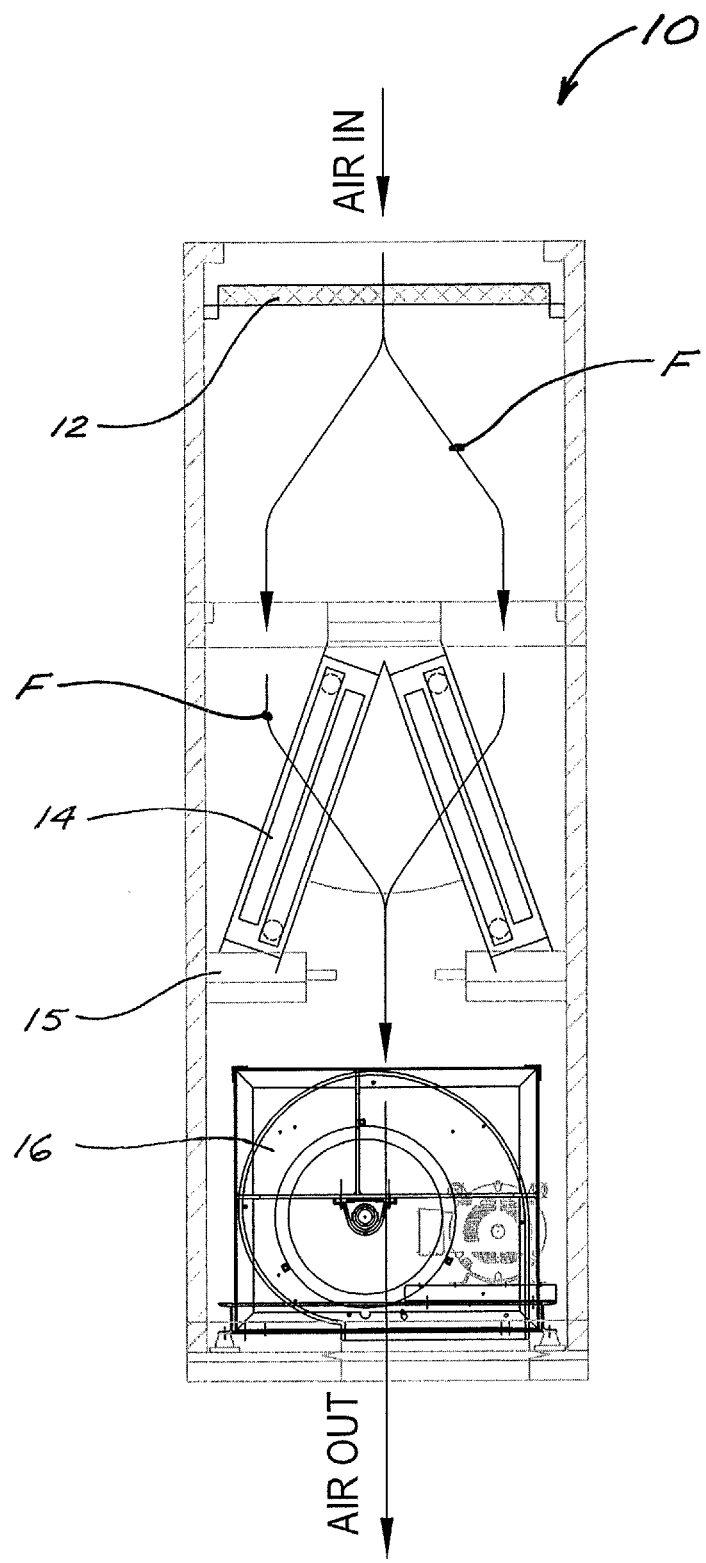
FIG. 1 is a schematic vertical cross-section through a prior art CRAC unit.

FIG. 1 illustrates a prior art CRAC unit 10 in which airflow (denoted by flow arrows F) enters the top of the unit (either directly from the room in which the unit is installed or, alternatively, via a duct bringing air from outside the room), passes through a filtration section 12, then through an A-frame banked cooling coil section 14, and then is discharged into the room at the bottom of the unit by means of supply fans 16. Drain pans 15 are provided to carry condensation off the coils 14 to a sump (not shown).

Figure 2:
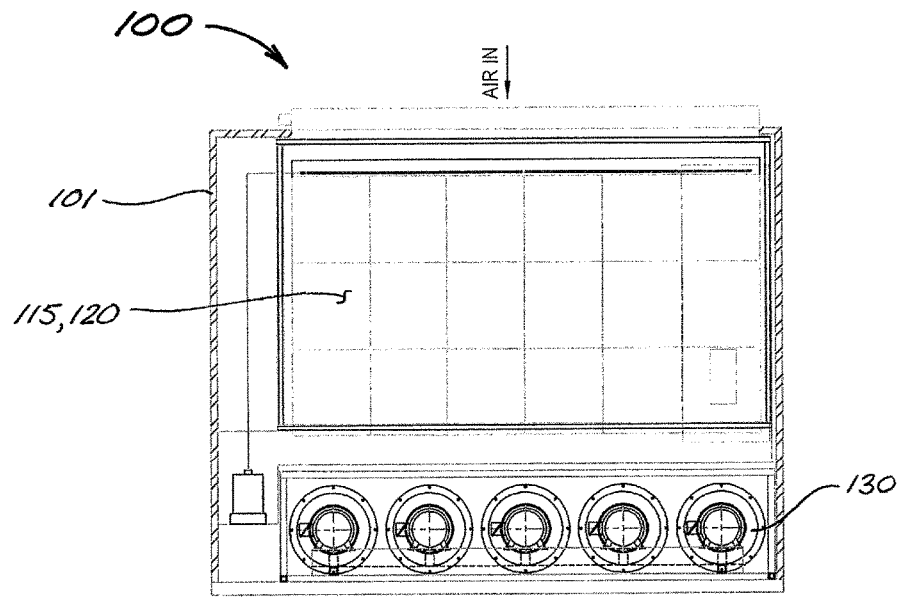
FIG. 2 is a longitudinal vertical section through a first embodiment of a CRAC unit in accordance with the present disclosure, incorporating evaporative cooling media and a drift eliminator.
Figures 3A, 3B:
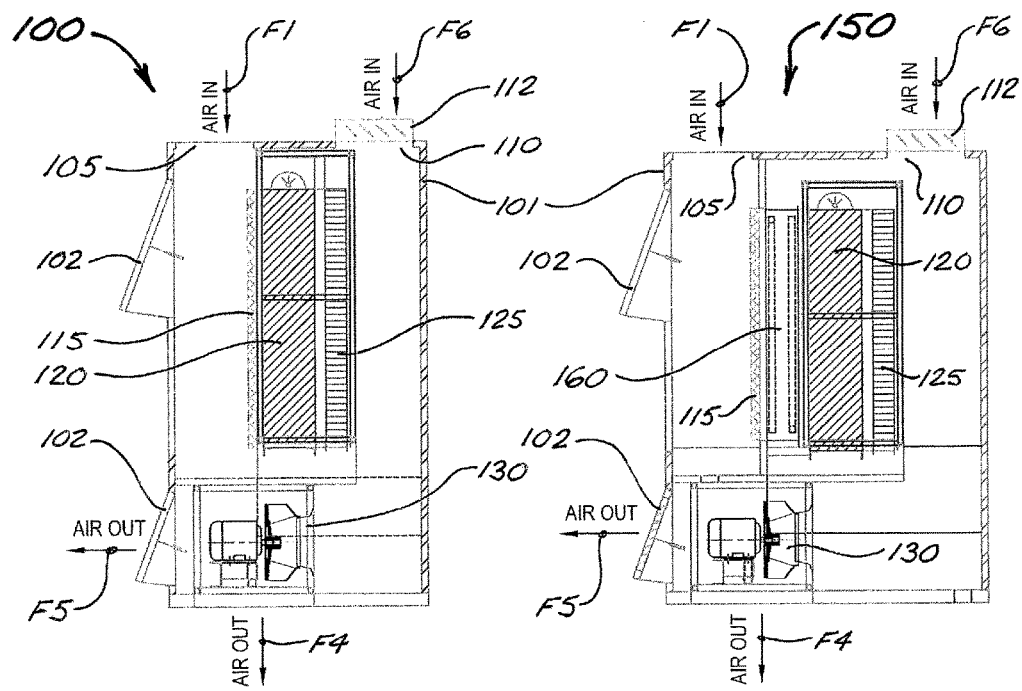
FIG. 3A is a transverse vertical section through the CRAC unit shown in FIG. 2.
FIG. 3B is a transverse vertical section through a variant CRAC unit similar to the embodiment shown in FIG. 3A but with a DX cooling coil added.

FIGS. 2 and 3A illustrate the general configuration and basic components of one CRAC unit embodiment 100 in accordance with the present disclosure. CRAC unit 100 comprises an enclosure 101 which has a first wall 103 and an opposing second wall 104, with either or both of walls 103 and 104 having access doors 102 as required for operation and maintenance. Enclosure 101 houses an assembly of air treatment equipment components which in the illustrated embodiment includes a filter section 115 and a cooling section 120. Filter section 115 and cooling section 120 are each of substantially uniform thickness with generally flat side surfaces, and they mounted within enclosure 101 so as to be substantially parallel and closely adjacent to each other (i.e., in parallel juxtaposition) and oriented vertically within the enclosure 101 between and generally parallel to walls 102 and 103. In the embodiment shown in FIG. 4, this arrangement of the air treatment component assembly results in the formation of a first chamber 140 between filter section 115 and first wall 103, and a second chamber 145 between cooling section 120 and second wall 104.

FIG. 3B shows a variant CRAC unit embodiment 150 similar to CRAC unit 100 but with a DX coil 160 added to the air treatment component assembly.

Figure 4:
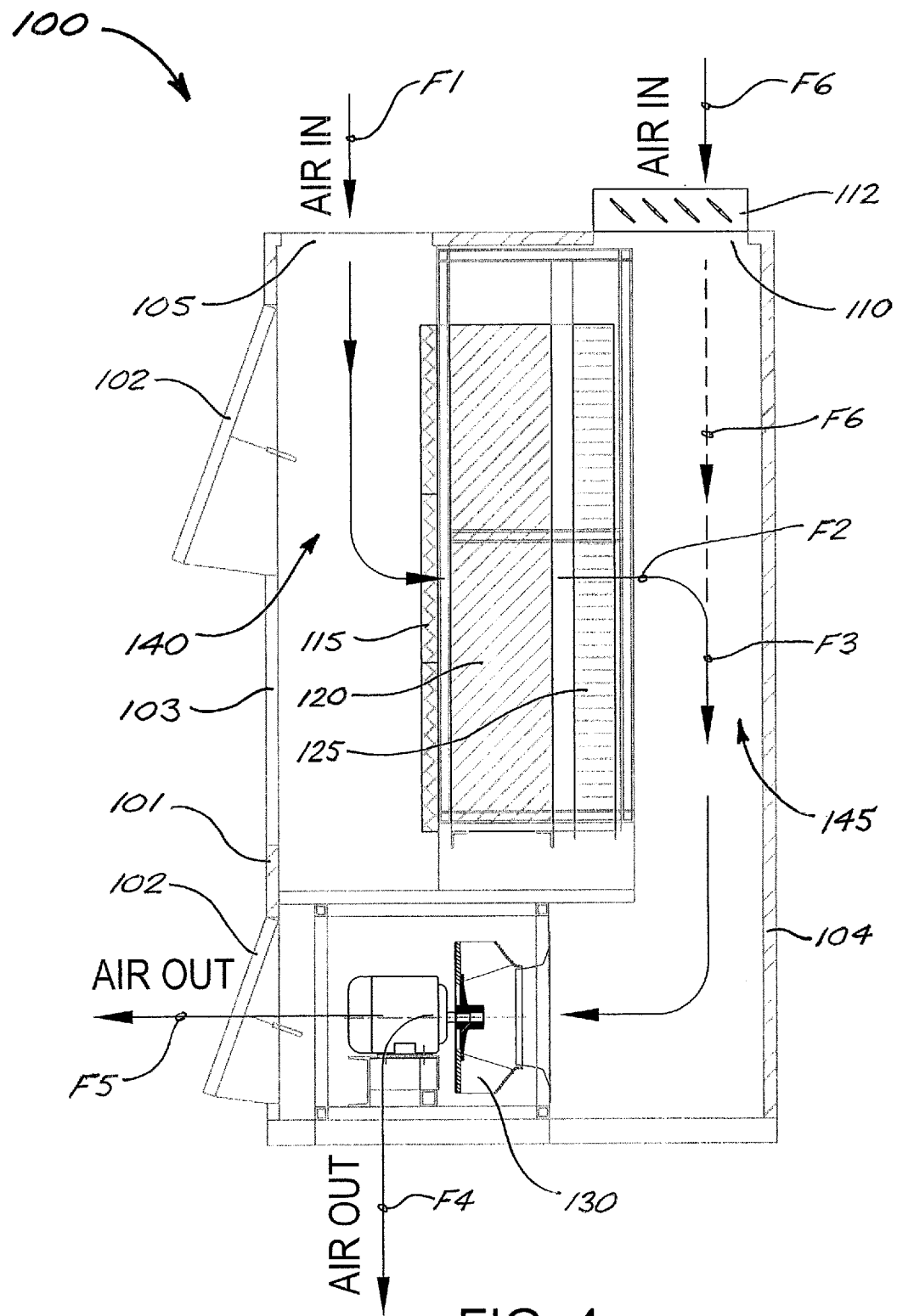
FIG. 4 is an enlarged vertical section through a CRAC unit as shown in FIG. 3A, in which air enters an upper region of the unit and exits from a lower region of the unit.

FIG. 4 illustrates the airflow path through CRAC unit embodiment 100. The airflow path through CRAC unit 150 would be similar to that shown in FIG. 4. CRAC units 100 and 150 are "downflow" units in which airflow through the unit is from top to bottom. However, these units can be readily adapted for upflow operation, such as in the variant CRAC unit embodiment 200 shown in FIG. 5, in which airflow through the unit is from bottom to top.

In the downflow CRAC unit 100 shown in FIG. 4, air enters a primary air intake 105 at the top of the unit, with the airflow initially being vertically downward (as denoted by airflow arrow F1) within first chamber 140, but then is diverted horizontally (as denoted by horizontal airflow arrow F2) through filter section 115 and cooling section 120. Cooling section 120 may comprise cooling coils and/or evaporative media. The use of direct evaporative cooling in a vertically-oriented CRAC unit is thus made possible by configuring the unit 100 such that the airflow pattern through the unit has a primary horizontal component F2 as illustrated in FIG. 4.

In the embodiment shown in FIG. 4, in which cooling section 120 includes evaporative media, CRAC unit 100 also incorporates a "drift eliminator" 125 (a term that will be well understood by persons skilled in the art) to remove any water droplets present in the airflow exiting the evaporative media, thus preventing what is known as "water carryover" from the evaporative media into the cooled air discharged from the unit. The airflow F2 downstream of drift eliminator 125 is diverted vertically downward (as denoted by airflow arrow F3) within second chamber 145 to a lower region of CRAC unit 100, from which it is discharged into the space to be cooled. As indicated in FIG. 4, the airflow discharge from CRAC unit 100 could be vertically downward (as denoted by airflow arrow F4), or alternatively horizontal (as denoted by airflow arrow F5) through the front and/or sides of the unit. Supply fans 130 propel the cooled air either directly into the space to be cooled or into connecting ductwork.

Also as shown in FIG. 4, CRAC unit 100 may optionally be provided with a bypass air intake 110 controlled by an intake damper 112 to allow a regulated downward flow of incoming air into second chamber 145 (as denoted by airflow arrow F6), bypassing cooling section 120 to allow for cooling capacity modulation, by blending the downward-flowing untreated bypass airflow F6 into the airflow F2 exiting cooling section 120 (and drift eliminator 125, as the case may be). Depending on the properties of the primary incoming airflow F1 (e.g., temperature and humidity), it may not always be necessary for all supplied air to pass through cooling section 120 of CRAC unit 100. For example, cooled air exiting cooling section 120 can be blended in suitable proportions with warmer untreated bypass air F6 to produce an airflow supply to the room at a temperature somewhere between the temperatures of the two airflows being blended.

Figure 5:
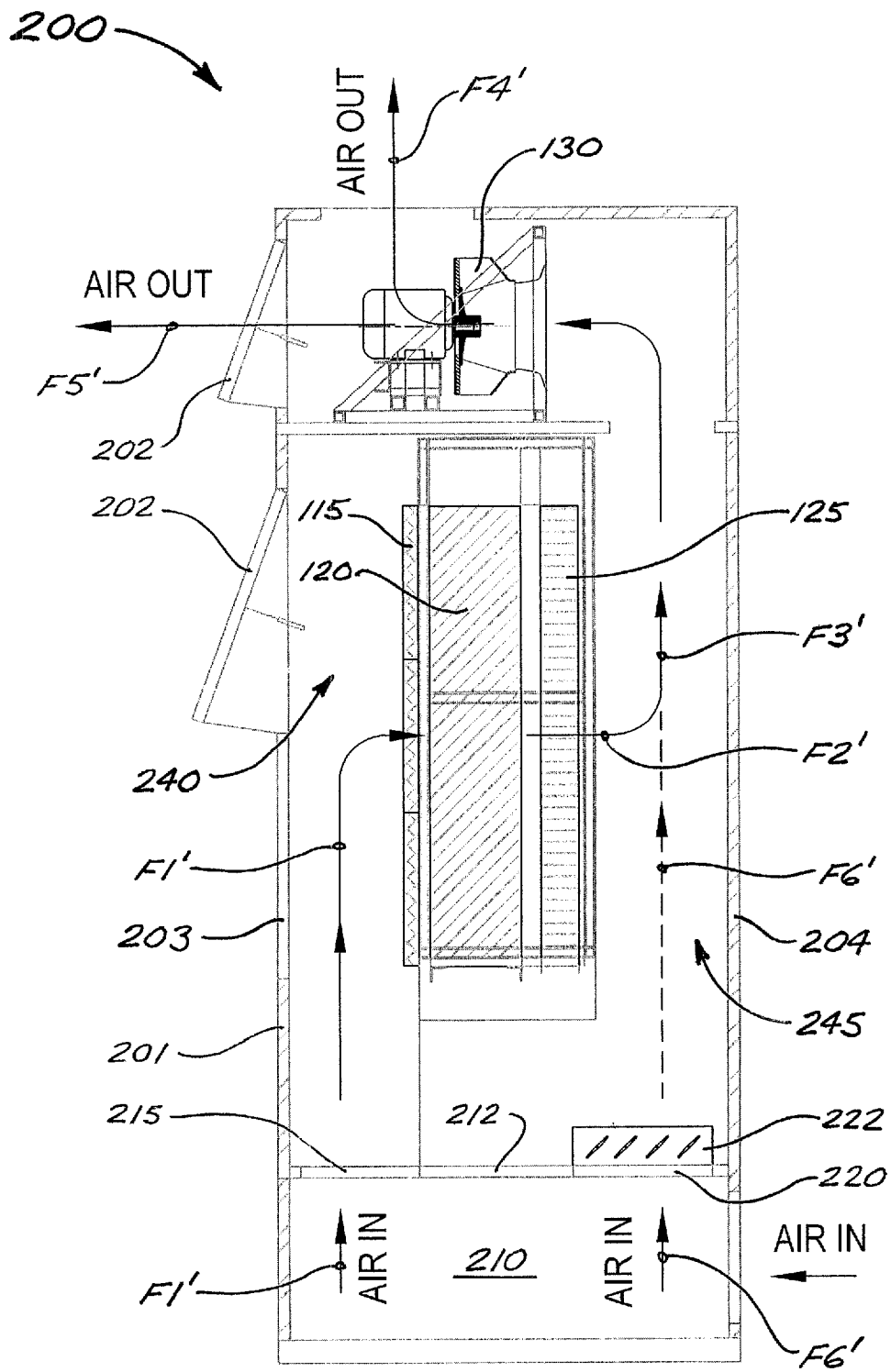
FIG. 5 is an enlarged vertical section through a variant embodiment of the CRAC unit shown in FIGS. 3A and 4, in which air enters a lower region of the unit and exits from a upper region of the unit.

The upflow CRAC unit embodiment 200 illustrated in FIG. 5 operates in substantially the same way as downflow CRAC unit embodiment in FIG. 4 except for the direction of airflow and correspondingly necessary modifications. In the illustrated embodiment, CRAC unit 200 comprises an enclosure 201 having first and second walls 203 and 204 (and access doors 202) and housing an air treatment component package comprising a filter section 115, cooling section 120, and drift eliminator 125 generally as in CRAC unit embodiments 100 and 150. Similar to CRAC unit 100 shown in FIG. 4, the arrangement of the air treatment component assembly within enclosure 201 results in the formation of a first chamber 240 between filter section 115 and first wall 203, and a second chamber 245 between cooling section 120 and second wall 204.

A lower portion of enclosure 201 defines an intake plenum 210 having a roof structure 212 defining a primary air intake 215 through which intake air (denoted by airflow arrow F1') can flow upward into first chamber 240 within enclosure 201 to be horizontally diverted (as denoted by horizontal airflow arrow F2') through filter section 115, cooling section 120, and drift eliminator 125.

The airflow F2' downstream of drift eliminator 125 is diverted vertically upward (as denoted by airflow arrow F3') within second chamber 245 to an upper region of CRAC unit 200, from which it is discharged into the space to be cooled by supply fans 130. As indicated in FIG. 5, the airflow discharge from CRAC unit 200 could be vertically upward (as denoted by airflow arrow F4'), or alternatively horizontal (as denoted by airflow arrow F5') through the front and/or sides of the unit.

Also as shown in FIG. 5, CRAC unit 200 optionally may be provided with a bypass air intake 220 controlled by an intake damper 222 to allow a regulated upward flow of incoming air into second chamber 245 (as denoted by airflow arrow F6'), bypassing cooling section 120 and flowing upward within second chamber 245 to mix with the airflow F2' exiting cooling section 120 and drift eliminator 125.

The airflow paths through the CRAC units shown in FIGS. 4 and 5 provide enhanced flexibility over prior art CRAC units and facilitate standardization of parts, thus avoiding the need for specialized components such as A-frame or V-frame coils and banked filters as in prior art CRAC units. The horizontal airflow across the internal components of the CRAC unit results in reduces face velocities across those components. Low face velocities increase filtration efficiency, prevent water carryover, reduce static pressure drop through the unit, and increase the cooling effectiveness of the cooling systems in the unit. The horizontal airflow in CRAC units in accordance with the present disclosure also allows for the use of direct evaporative cooling systems within the units using saturated evaporative media pads.

CRAC units in accordance with the present disclosure can be adapted to use a variety of cooling systems, including but not limited to chilled water, DX refrigeration, and direct evaporative cooling systems. A wide range of airflows and static pressures can be accommodated. The CRAC units and associated control systems can be designed to provide reliable data center climate control while significantly reducing the electrical energy consumption of the computer room or data center's HVAC system.

CRAC units in accordance with the present disclosure can be manufactured as packaged pieces of equipment, requiring a single-point electrical connection and communications connection as well as one piping connection each for water and drain for easy unit set-up on site. Outdoor air and return air can be mixed remotely via the building's ventilation system and ducted into the CRAC unit.

In preferred embodiments, CRAC units as disclosed herein are controlled by dedicated, onboard PLCs (programmable logic controllers). Each CRAC unit's onboard controller controls all aspects of the unit's operation, including monitoring internal temperatures, modulating fan speed, and operation of the cooling systems.

Variants of the disclosed CRAC units can be adapted in accordance with one or more options as listed below with respect to airflow configuration, air conditioning method, control type, and fan type:

Flow Configuration

Both downflow or upflow configurations are readily adaptable for mounting in rooms with or without raised floor systems, for example:

Downflow units with an air intake in the upper section of the unit (top, front, side, or back), and an air discharge outlet in a lower region of the unit (bottom, front, side, or back).

Upflow units with an air intake in the lower section of the unit (bottom, front, side, or back), and an air discharge outlet in a upper region of the unit (top, front, side, or back).

Air Conditioning Method

One or more air conditioning options can be used in a given CRAC unit, for example:

Direct evaporative cooling—uses adiabatic evaporative cooling to cool the air stream by streaming water down an internal evaporative media pad. All components of the evaporative cooling system are provided integral to the unit.

Water cooling—uses water passing through a coil in the CRAC unit to act as a cooling medium. Various cooling sources are possible, including:

Chilled water using the building's chilled water system. Cooling provided by air-cooled or water-cooled chillers.

Waterside economizer: water is cooled using an outdoor drycooler or indirect evaporative cooler; this can be used independently or in conjunction with a water-cooled chiller.

Seawater, river water, irrigation water, or water from other natural sources can be passed through a coil to provide cooling.

DX cooling—uses a refrigeration-based direct expansion (DX) coil to cool the airstream, with a rooftop condensing unit to provide heat rejection.

Heating—for applications requiring specific dehumidification reheat, a heating coil can be provided to warm the airstream; heating coils may be of hot water or electric element types.

CRAC Unit Control

CRAC units in accordance with the present disclosure can use a variety of different control options, preferably including an onboard PLC controller capable of handling all unit functions, and optionally including any of the following:

Full stand-alone unit control—all CRAC unit control is carried out by the onboard controller. Units can modulate remote dampers, control fan speed, choose modes of cooling, modulate valves, control pumps, etc.

Remote automatic control—some high-level unit control is handled by a remote building management system (BMS) or by a dedicated central control system for the CRAC units. Modes of cooling and overall enable/disable functions are controlled by the external controller, as well as operating setpoints. Full CRAC unit information can be sent to the remote controller, and the remote controller is capable of controlling any part of the unit as may be desired.

Constant/variable air volume—supply fans can be speed-controlled for variable-volume systems. For constant air volume operation, the speed controller is set to a constant value at the time of CRAC unit start-up.

Sensors—various sensors can be provided with the CRAC unit for various control aspects. Examples of sensors include temperature, humidity, smoke detection, and water detection.

Miscellaneous control options—other modes of operation such as control of external devices such as duct-mixing dampers and remote pumps, etc.

Fan Types

CRAC units in accordance with the present disclosure can be adapted to accommodate a variety of different required airflows and system static pressures according to the type of fans selected. For compactness of size and pressure-handling capabilities, the preferable fan type is an airfoil-blade backwards-inclined plenum fan. However, other types of fans such as forward and backward curved centrifugal scroll fans could also be used.

It will be readily appreciated by those skilled in the art that various modifications to embodiments in accordance with the present disclosure may be devised without departing from the scope and teaching of the present teachings, including modifications which may use equivalent structures or materials hereafter conceived or developed. It is to be especially understood that the scope of the claims appended hereto should not be limited by any particular embodiments described and illustrated herein, but should be given the broadest interpretation consistent with the description as a whole. It is also to be understood that the substitution of a variant of a claimed element or feature, without any substantial resultant change in functionality, will not constitute a departure from the scope of the disclosure.

In this patent document, any form of the word "comprise" is intended to be understood in its non-limiting sense to mean that any item following such word is included, but items not specifically mentioned are not excluded. A reference to an element by the indefinite article "a" does not exclude the possibility that more than one such element is present, unless the context clearly requires that there be one and only one such element. Any use of any form of any term describing an interaction between elements is not meant to limit the interaction to direct interaction between the elements in question, but may also extend to indirect interaction between the elements such as through secondary or intermediary structure.

Relational terms such as "vertical", "horizontal", and "parallel", are not intended to denote or require absolute mathematical or geometrical precision. Accordingly, such terms are to be understood as denoting or requiring substantial precision only (e.g., "substantially vertical" or "generally vertical") unless the context clearly requires otherwise. Any use of any form of the term "typical" is to be interpreted in the sense of representative of common usage or practice, and is not to be interpreted as implying essentiality or invariability.

The invention claimed is:

1. An air conditioning unit for use in a building space which is occupied by electrical equipment comprising:
   (a) an enclosure having a first wall, a second wall opposite the first wall, and a primary air intake in an upper region of the enclosure;
   (b) an air treatment component assembly comprising a filter section and a direct evaporative cooling section installed in parallel juxtaposition and mounted vertically within the enclosure so as to define a first chamber between the vertically mounted component assembly and the enclosure's first wall and a second chamber between the vertically mounted component assembly and the enclosure's second wall;
   such that air entering the primary air intake from outside the enclosure will flow, in sequence, vertically downward within the first chamber, meet with a resistive barrier at the vertically mounted filter section, thereby equalizing pressure over the entire surface of the vertically mounted filter section, and then pass horizontally through the vertically mounted component assembly into the second chamber, and vertically downward within the second chamber toward a discharge outlet in a lower region of the enclosure.

2. The air conditioning unit as in claim 1 wherein a bypass air intake is provided in the upper region of the enclosure, such that air entering the bypass air intake from outside the enclosure will flow vertically downward within the second chamber so as to mix with air flowing horizontally into the second chamber after passing through the vertically mounted component assembly.

3. The air conditioning unit as in claim 2, further comprising an intake damper for regulating the flow of air through the bypass air intake.

4. An air conditioning unit for use in a building space which is occupied by electrical equipment comprising:
   (a) an enclosure having a first wall, a second wall opposite the first wall, and a primary air intake in a lower region of the enclosure;
   (b) an air treatment component assembly comprising a filter section and a direct evaporative cooling section installed in parallel juxtaposition and mounted vertically within the enclosure so as to define a first chamber between the vertically mounted component assembly and the enclosure's first wall and a second chamber between the vertically mounted component assembly and the enclosure's second wall;
   such that air entering the primary air intake from outside the enclosure will flow, in sequence, vertically upward within the first chamber, meet with a resistive barrier at the vertically mounted filter section, thereby equalizing pressure over the entire surface of the vertically mounted filter section, and then pass horizontally through the vertically mounted component assembly into the second chamber, and vertically upward within the second chamber toward a discharge outlet in an upper region of the enclosure.

5. The air conditioning unit as in claim 4 wherein a bypass air intake is provided in the lower region of the enclosure, such that air entering the bypass air intake from outside the enclosure will flow vertically upward within the second chamber so as to mix with air flowing horizontally into the second chamber after passing through the vertically mounted component assembly.

6. The air conditioning unit as in claim 5, further comprising an intake damper for regulating the flow of air through the bypass air intake.

\* \* \* \* \*